United States Patent [19]

Tomohiro

[11] Patent Number: 5,220,682
[45] Date of Patent: Jun. 15, 1993

[54] AUTOMATIC BROADCAST WAVE TUNING DEVICE FOR RDS RECEIVER

[75] Inventor: Ryou Tomohiro, Sanda, Japan

[73] Assignee: Mitsubishi Denki Kabushiki Kaisha, Tokyo, Japan

[21] Appl. No.: 765,943

[22] Filed: Sep. 26, 1991

[30] Foreign Application Priority Data

Oct. 5, 1990 [JP] Japan .................................. 2-268782

[51] Int. Cl.⁵ ............................................. H04B 17/02
[52] U.S. Cl. ................................ 455/161.2; 455/161.3; 455/184.1; 455/186.1
[58] Field of Search ............... 455/166.1, 161.2, 161.3, 455/180.3, 183.2, 184.1, 186.1, 226.2

[56] References Cited

U.S. PATENT DOCUMENTS 4,326,297  4/1982  Sato et al. ........................... 455/213

FOREIGN PATENT DOCUMENTS 0386836   9/1990  European Pat. Off. .
30161118 11/1980  Fed. Rep. of Germany .
3835870   1/1990  Fed. Rep. of Germany ... 455/186.1
0067037   5/1989  Japan ................................. 455/184.1
0204529   8/1989  Japan ................................. 455/186.1
2104133   4/1990  Japan .
2105731   4/1990  Japan .
0124648   5/1990  Japan ................................. 455/161.2

Primary Examiner—Reinhard J. Eisenzopf
Assistant Examiner—Christine K. Belzer

[57] ABSTRACT

An automatic broadcast wave tuning device for a RDS receiver includes a controller to enforce the RDS receiver to receive the former broadcast wave by setting a forbidden flag under such conditions as being unable to receive a program identification code when a receiving signal level of the broadcast wave within the same broadcasting network is above a predetermined signal level, or in the case of being able to receive the program identification code when failing to meet up with that of the broadcasting station presently in contact. Hence, from the next automatic receiving frequency tuning, a control is provided for setting a frequency divisional ratio of the phase-locked loop circuit in order to select the best broadcast station of all by discriminating reception signal levels of the broadcast waves transmitted by all the broadcasting stations bearing no forbidden flag.

5 Claims, 2 Drawing Sheets

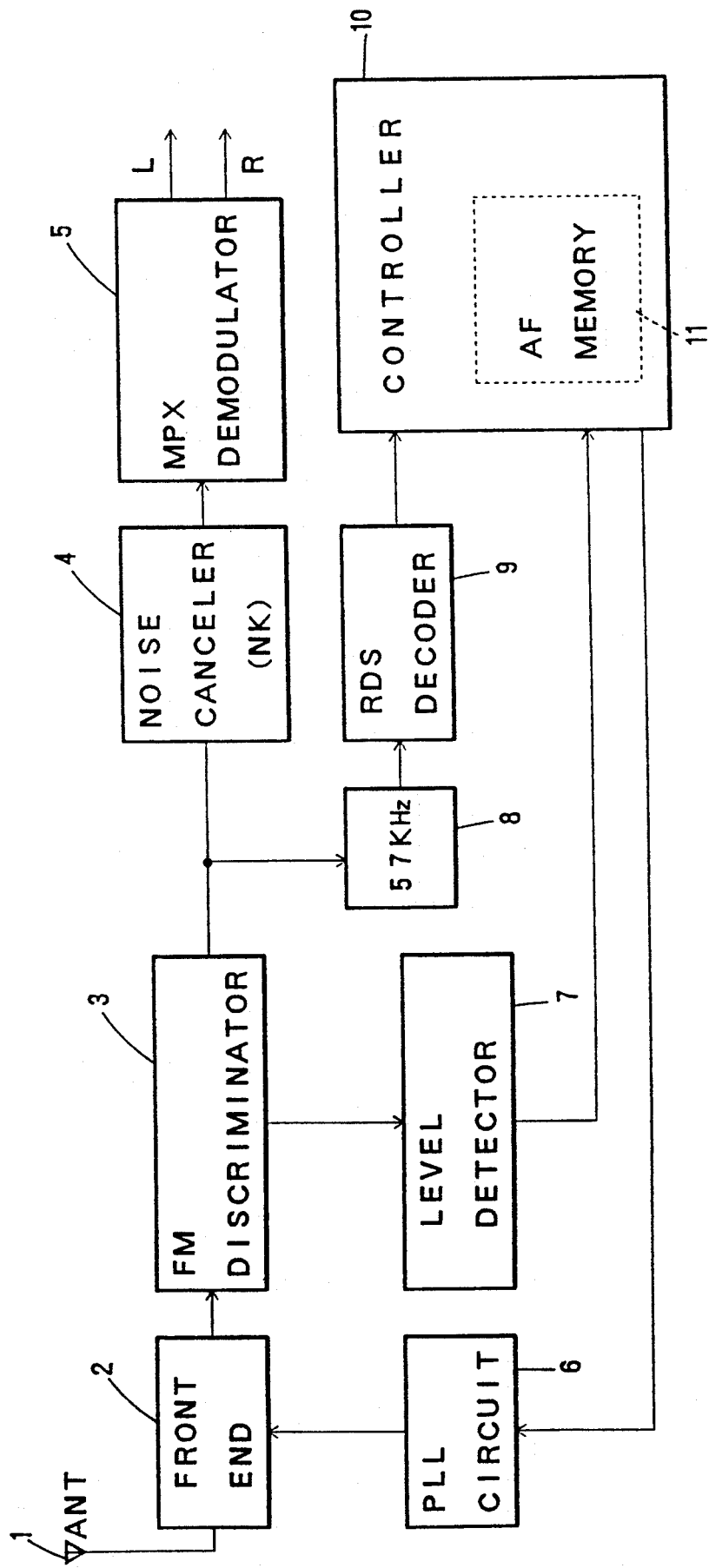

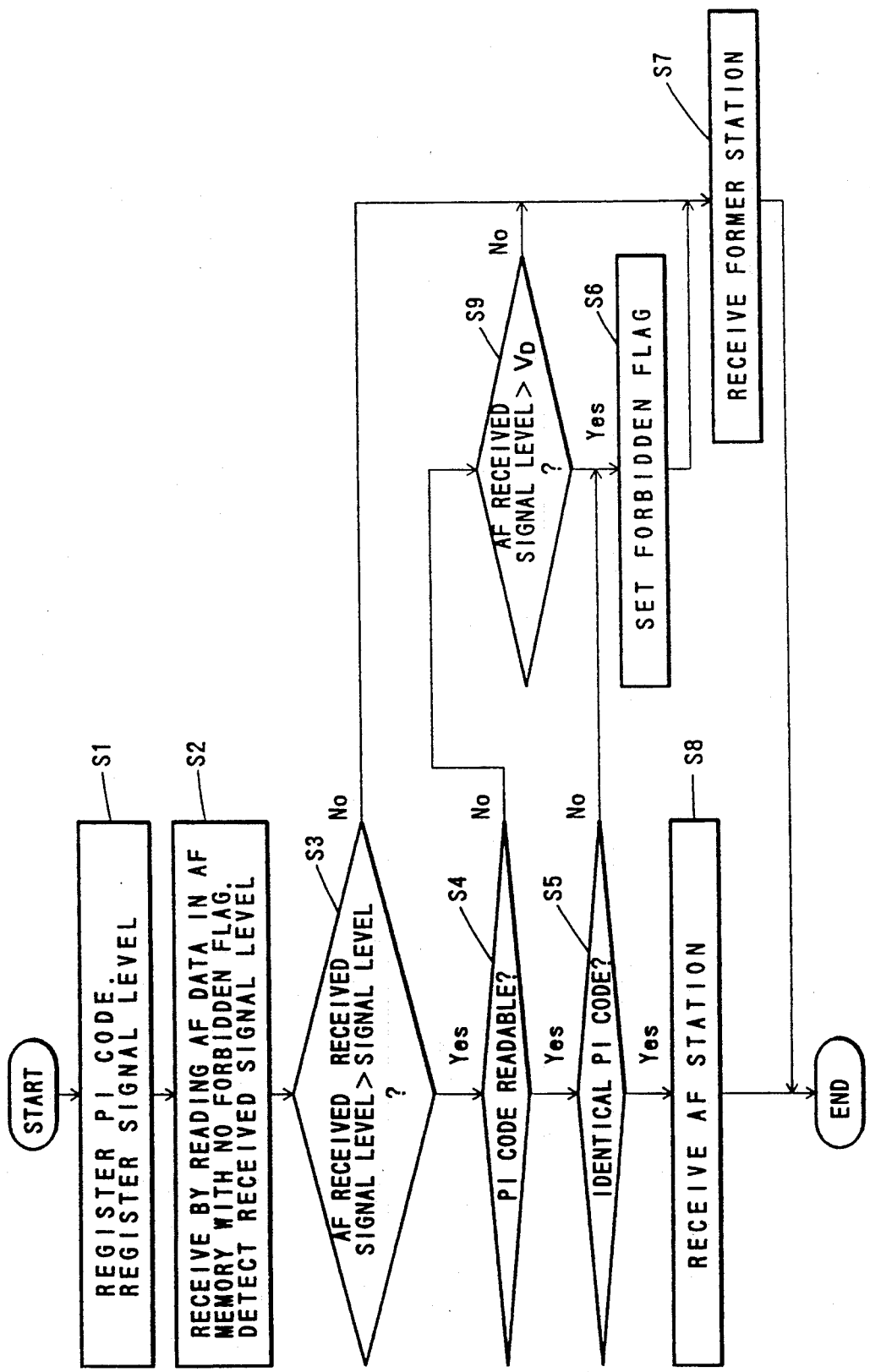

AUTOMATIC BROADCAST WAVE TUNING DEVICE FOR RDS RECEIVER

BACKGROUND OF THE INVENTION

1. Field of the Invention

This invention relates to an automatic broadcast wave tuning device and, more particularly, to an automatic broadcast wave tuning device for a radio data system (hereinafter referred to as RDS) receiver to receive RDS data wherein the radio receiver is controlled to tune in a broadcast wave bearing RDS data transmitted by a broadcasting station.

2. Description of the Prior Art

As a well known radio service, a radio data system (RDS) is common in Europe for providing broadcast wave listeners with a radio service. In such RDS, informative data relating to broadcast programs are transmitted simultaneously with the broadcast programs in a multiplex modulation from broadcasting stations and, upon receiving the broadcast waves, a desired broadcast program is selected by a broadcast wave listener based on demodulated data.

The RDS is a data system standardized in the Europe Broadcasting Union (EBU), wherein the data relating to the broadcast such as broadcast programs and the like are coded into a two phase Differential Phase Shift Keying (DPSK) signal having a bit rate of 1187.5 bps, and these coded data are transmitted by frequency-modulating a sub-carrier in such that modulating a 57 KHz sub-carrier in accordance with a double-sideband carrier suppression amplitude modulation.

In the RDS, the whole data are transmitted as a unit which is called a group consisting of 104 bits. One group in turn consists of four blocks, each of which consists of 26 bits. The data contained in each group are prescribed depending on their locations, whereby 16 bits of the first block always designate a program identification code (PI code), while in the second block, the first 5 bits designate a group-type code, the next one bit designates a traffic-program identification code (TP code), and the next succeeding 5 bits designate a program type code (PTY code).

Further, the contents of the remaining are a traffic announcement identification code (TA code), program service name data (PS data) such as broadcasting station names, broadcasting network names and the like, and a list of alternative frequencies data (AF data) for identifying broadcasting network stations which broadcast the same program.

In a motor vehicle-mounted RDS receiver, a poor reception is quite often encountered while listening to a broadcast during a motor vehicle travel. However, in the RDS broadcast, since the AF data of the broadcasting stations within the same broadcasting network, which stations are broadcasting the same broadcast program on different frequencies, are available as described above, it is possible to tune in another broadcasting station within the same broadcasting network having a greater signal level, or a stronger electric field strength, than that of the broadcasting station presently tuned in based on the AF data stored in a memory for chasing the same broadcast program.

However, there has been a problem for causing faulty operation of the RDS receiver depending on a course of the motor vehicle such that the RDS receiver might come across a broadcasting station, out of but neighboring to the broadcasting network, having the AF data allocated to the same frequency as that of the broadcasting station within the broadcasting network, or the RDS receiver might tune in a wrong program as there are so-called non RDS broadcasting stations which are not capable of transmitting RDS data. This kind of faulty operation often happens when the motor vehicle is driven through many countries in Europe along the boundaries.

Further, wrong AF data may have been stored in a memory due to an unknown reason in a duration of demodulating the received RDS data and this results in a problem for causing improper selection in the automatic tuning operation. A prior-art-type automatic tuning device is disclosed, for example, in the patent application laid-open No. 2-105731.

It is therefore an object of this invention to eliminate the problems encountered by prior-art-type RDS receivers and to provide an automatic broadcast wave tuning device which is capable of preventing a RDS receiver from faulty operation.

SUMMARY OF THE INVENTION

An automatic broadcast wave tuning device for a RDS receiver embodying the present invention comprises an alternative frequencies data memory for storing at least one or more lists of alternative frequencies data being transmitted formerly by the broadcasting stations in contact and a controller.

The controller provides a control for setting a frequency divisional ratio of a phase-locked loop in such a way as to enforce the RDS receiver back to receive the former broadcast wave by setting a forbidden flag for forbidding the receiving frequency from changing, within the same broadcasting network, under such conditions as being unable to receive a network identification code but a receiving signal level of a broadcast wave within the same broadcasting network is above a predetermined signal level, or to enforce the RDS receiver back to receive the former, immediately before, broadcast wave by setting the forbidden flag without discriminating the receiving signal level and forbid the RDS receiver from changing to receive a broadcast wave of the same network station having the forbidden flag while in case of being able to receive the broadcasting network identification codes but failing to meet up with that of the broadcasting station presently in contact.

The controller in accordance with this invention checks, upon initiation of automatic tuning, program identification codes of the broadcasting stations, which are designated by the stored list of alternative frequencies data, starting from the broadcasting station presently in reception then to others. Whereby if the program identification code is detected to be wrong, it must be whether a wrong list of alternative frequencies data is stored in an alternative frequencies data memory or the stored list of alternative frequencies data must be the one assigned to a broadcasting station in another broadcasting network, thus setting up a forbidden flag, independently, to respective data in the stored list of alternative frequencies data.

Further, if it is impossible to receive any of the program identification codes, since it is hard to determine whether the broadcasting station is a non RDS broadcasting station having no program identification code or the broadcasting station is a RDS broadcasting station but the broadcast wave from which is too weak to recognize the program identification code, it is determined whether or not the receiving signal level is at or above the predetermined signal level, whereas if it is, the broadcasting station is considered to be a non RDS broadcasting station and setting up a forbidden flag thereto.

Accordingly, from the next operation for the automatic reception frequency tuning, provided is a control for setting a frequency divisional ratio of the phase-locked loop circuit in order to select the best broadcast station of the all by discriminating receiving signal levels of the broadcast waves transmitted by all the broadcasting stations bearing no forbidden flag.

BRIEF DESCRIPTION OF THE DRAWINGS

FIG. 1 is a block diagram showing an automatic broadcast wave tuning device for a RDS receiver embodying the present invention; and FIG. 2 is a flowchart showing operational steps to be implemented by the controller installed in the automatic broadcast wave tuning device of FIG. 1.

DETAILED DESCRIPTION OF THE PREFERRED EMBODIMENT

A preferred embodiment of this invention will now be described in detail by referring to the accompanying drawings. Referring to FIG. 1, there is shown a block diagram illustrating an automatic broadcast wave tuning device for a RDS receiver to implement the automatic turning operation in accordance with the present invention.

In FIG. 1, an element 1 designates an antenna, FM multiplex broadcast waves received by the antenna 1 are fed to a front end 2 for selectively receiving a desired broadcast wave of an selected broadcasting station, and thereby the selected broadcast wave is converted into an intermediate frequency (IF) and fed to a frequency discriminator (FM detector) 3.

The front end 2 is under the control of a phase-locked loop (hereinafter referred to as PLL) circuit 6 including a programmable frequency divider (will be described in detail hereinafter), a dividing ratio of which is controlled by a controller 10 for providing the tuning operation.

A discriminated output of the frequency discriminator 3 is fed to a multiplex (hereinafter referred to as MPX) demodulator circuit 5 through a noise canceler (hereinafter referred to as NK) 4 for deriving a L (left) channel signal and a R (right) channel signal therefrom in case of a stereophonic broadcasting.

A RDS data signal is extracted from the discriminated output of the frequency discriminator 3 by passing through a 57 KHz band-pass filter 8 and fed to a RDS decoder 9 for decoding it into data readable by the controller 10. The controller 10 contains an AF memory 11, wherein obtained informative data relating to the broadcasting stations in contact (aforesaid data PI, AF, PS, TP, TA and the like) are stored.

Further, there is provided a level detector 7 for detecting a received signal level (electric field strength level) based on the IF signal level fed from the frequency discriminator 3. The received signal level detected by the level detector 7 is then fed to the controller 10.

In operation, FM multiplex broadcast waves received by the antenna 1 are fed to the front end 2, whereby a broadcast wave of a desired broadcasting station is selected and applied to the frequency discriminator 3 after being converted into the intermediate frequency.

A discriminated output of the frequency discriminator 3 is fed to the MPX demodulator circuit 5 through the NK 4, and which discriminated output is then decoded for outputting the L and R channel audio signals therefrom in case of the stereophonic broadcasting.

Further, the discriminated output of the frequency discriminator 3 is fed to the RDS decoder 9 through the 57 KHz band-pass filter 8, and thereby the discriminated output is decoded into data readable by the controller 10.

The controller 10 takes in the informative data PI, AF, PS, TP, TA and the like, and stores the AF data in the AF memory 11.

The level detector 7 detects a received signal level (electric field strength level) based on the IF signal level fed from the frequency discriminator 3, and feeds a detected resultant to the controller 10.

Operational steps to be implemented by the controller 10 of the automatic broadcast wave tuning device of FIG. 1 will be described by referring to the flowchart shown in FIG. 2.

The following table 1 illustrates the data stored in the AF memory 11.

TABLE 1

| AF memory | AF frequency data storage area | forbidden flag storage area |
|---|---|---|
| No. 1 | $f_1$ | 0 |
| No. 2 | $f_2$ | 0 |
| No. 3 | $f_3$ | 1 |
| No. 4 | $f_4$ | |
| . | . | |
| . | . | |
| No. N | $f_N$ | |

In the table 1 above, AF data lists are shown by characters of $f_1, f_2, f_3 \ldots f_n$, whereby the AF data list $f_3$, for example, is accompanied by a forbidden flag. It is assumed that data representing more than one broadcasting station are stored in the AF memory 11 at an AF frequency data storage area shown in the table 1.

At step S1, the PI code of the broadcasting station presently tuned in is registered at the AF memory 11 contained in the controller 10 as being fed through the 57 KHz band-pass filter 8 and the RDS decoder 9, and all that the discriminated output of the frequency discriminator 3 is detected at the level detector 7 for deriving the received signal level therefrom and the derived signal level is also registered at the AF memory 11 in the controller 10.

After registering the data at the AF memory 11 in the controller 10, the program goes to step S2. At step S2, one of the stored AF data with no forbidden flag is selected and read it from the AF memory 11, setting a frequency divisional ratio for the PLL circuit 6 based on the read out AF data, and then the front end 2 initiates the tune-in operation in accordance with the frequency divisional ratio being set for receiving the broadcast wave of the AF station that corresponds to the selected AF data.

It is then determined, by comparison, at step S3 whether or not a received signal level of the AF station is greater than that of the former broadcasting station. If it is not, the program goes to step S7, whereas, if it is, it is then determined at step S4, after a predetermined period of time, whether or not the PI code of the AF station is detectable. If it is not, the program goes to step S9, whereas, if it is determined that the PI code is detectable at step S4, it is then checked at step S5 whether or not the detected PI code coincides with the PI code registered in the AF memory 11 at step S1. If it is not, the program goes to step S6, whereas, if it is, the program goes to step S8 for receiving the broadcast wave from the AF station, in other words, the reception of broadcast wave is switched from the former broadcasting station to a newly selected AF station.

If it is determined at step S3 that the received signal level of the AF station is not greater than that of the former broadcasting station, or if it is determined at step S4 that the PI code of the AF station is not detectable and that the received signal level of the AF station is determined to be less than a predetermined signal level of $V_D$ at step S9, the program goes to step S7 for receiving the broadcast wave transmitted by the former broadcasting station without setting the forbidden flag to the corresponding AF data. That is a state of awaiting for the next chance.

At step S9, if it is determined that the received signal level of the AF station detected at the signal level detector 7 is greater than the predetermined signal level $V_D$, the program goes to step S6, and setting the forbidden flag to the corresponding AF data.

In like way, if it is determined at step S5 that the PI code of the AF station is not the same as that of the data stored in the AF memory 11, the program goes to step S6, and writing the forbidden flag into the corresponding forbidden flag storage area (shown in the table 1) of the AF memory 11.

Upon implementation of step S6 as described above, the program goes to step S7, whereby the RDS receiver is brought back to tune in the former broadcasting station.

Accordingly, the AF data accompanying the forbidden flag will no longer be selected in the operational step of S2, thus preventing the malfunction of the automatic broadcast wave tuning device while in the tuning operation.

In the embodiment described above, the received signal level of the AF station has been compared one after another with the signal level of the broadcasting station presently in reception, however, the present invention can be utilized in such an automatic system wherein a part or the whole frequencies that correspond to the stored AF data in the AF memory 11 may be checked successively for selecting the best broadcasting station to tune in.

As it has been described above, in accordance with this invention, the forbidden flag is provided not only when it is determined that the received PI code is not identical with the one being stored while the AF station coincides with a RDS station in a different broadcasting network, but when it is assumed that the AF station is a non RDS station through the implementation of the operational step for determining whether or not the received signal level of the AF station is at or above the predetermined signal level in case of not receiving the PI code of the AF station. Therefore, it is possible to prevent the RDS receiver from causing malfunction in the operation against the RDS or non RDS broadcasting stations.

It is to be understood by those skilled in the art that the foregoing descriptions relate only to preferred embodiment of the invention and that various changes and modifications may be made in the invention without departing from the spirit and scope thereof.

What is claimed is:

1. An automatic broadcast wave tuning device for a radio data system (RDS) receiver comprising:
   a front end unit for receiving a RDS broadcast wave carrying a list of alternative frequencies data (AF) and a program identification code (PI) of a group of broadcasting stations, which belong to the same broadcasting network, by tuning in a broadcasting station within the same broadcasting network;
   a phase-locked loop (PLL) circuit for performing the tune-in operation of the front end unit by varying a frequency divisional ratio thereof;
   a frequency discriminator for discriminating a frequency modulated (FM) signal output of the front end unit;
   a multiplex demodulator circuit for outputting an audio signal by demodulating a discriminated output of the frequency discriminator;
   a level detector for detecting a received signal level by accepting the discriminated output of the frequency discriminator;
   a RDS decoder for decoding the discriminated output of the frequency discriminator into prescribed readable data;
   an alternative frequencies (AF) data memory for storing the program identification code (PI) carried by the broadcast wave presently tuned in; and
   a controller connected to the phase-locked loop (PLL) circuit, the level detector and the RDS decoder for controlling the frequency divisional ratio of the phase-locked loop (PLL) circuit by receiving an detected output of the level detector and a decoded output of the RDS decoder,
   whereby the control is performed such that it is determined whether or not the program identification code (PI) is readable based on the detected output of the level detector, when it is determined that the program identification code (PI) is unreadable but a received signal level of the broadcast wave of the broadcasting station within the same broadcasting network is at or above a predetermined signal level, the frequency divisional ratio of the phase-locked loop (PLL) circuit is so controlled as to tune in the former broadcast wave by setting a forbidden flag to the corresponding frequency for forbidding the next tune-in to the broadcast wave of the broadcasting station within the same broadcasting network carrying the forbidden flag, whereas when it is determined that the program identification code (PI) is readable but the readable program identification code (PI) is not identical with that of the broadcast wave presently tuned in, the frequency divisional ratio of the phase-locked loop (PLL) circuit is so controlled, without discriminating a level of the received signal from the detected output of the level detector, so as to return to tune in the former broadcast wave by setting the forbidden flag to the corresponding frequency and so as to not switch to the broadcast wave of the broadcasting station carrying the forbidden flag in the next switching operation within the same broadcasting network.

2. An automatic broadcast wave tuning device as defined in claim 1, further including a band-pass filter interposed between the frequency discriminator and the RDS decoder.

3. An automatic broadcast wave tuning device as defined in claim 1, further including a noise canceler interposed between the frequency discriminator and the multiplex demodulator circuit.

4. An automatic broadcast wave tuning device as defined in claim 1, wherein said alternative frequencies data memory is contained in the controller.

5. An automatic broadcast wave tuning device as defined in claim 1, wherein said alternative frequencies data memory has an AF data storage area for storing AF data and a forbidden flag storage area for storing forbidden flags.

* * * * *